(12) United States Patent
Zheng et al.

(10) Patent No.: US 11,856,811 B2
(45) Date of Patent: Dec. 26, 2023

(54) TOP EMITTING AMOLED DISPLAY PANEL, MANUFACTURING METHOD THEREOF, AND DISPLAY DEVICE

(71) Applicant: Shenzhen China Star Optoelectronics Semiconductor Display Technology Co., Ltd., Guangdong (CN)

(72) Inventors: Zhilin Zheng, Guangdong (CN); Jia Tang, Guangdong (CN); Xiaoxing Zhang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 613 days.

(21) Appl. No.: 17/056,436

(22) PCT Filed: Oct. 22, 2020

(86) PCT No.: PCT/CN2020/122680
§ 371 (c)(1),
(2) Date: Nov. 18, 2020

(87) PCT Pub. No.: WO2022/047915
PCT Pub. Date: Mar. 10, 2022

(65) Prior Publication Data
US 2022/0310968 A1   Sep. 29, 2022

(30) Foreign Application Priority Data
Sep. 7, 2020   (CN) .......................... 202010928470.X

(51) Int. Cl.
*H01L 29/08* (2006.01)
*H10K 50/844* (2023.01)
(Continued)

(52) U.S. Cl.
CPC .......... *H10K 50/844* (2023.02); *H10K 50/86* (2023.02); *H10K 71/00* (2023.02); *H10K 2102/00* (2023.02); *H10K 2102/3026* (2023.02)

(58) Field of Classification Search
CPC ...... H10K 50/844; H10K 71/00; H10K 50/86; H10K 2102/00; H10K 2102/3026;
(Continued)

(56) References Cited

U.S. PATENT DOCUMENTS

| 10,170,040 B2 * | 1/2019 | Ogawa | G02F 1/1343 |
| 2015/0279872 A1 * | 10/2015 | Kato | H01L 27/1255 |
| | | | 257/532 |
| 2016/0020422 A1 * | 1/2016 | Kim | H10K 50/824 |
| | | | 257/40 |

FOREIGN PATENT DOCUMENTS

| CN | 108206192 | 6/2018 |
| CN | 110034159 | 7/2019 |

(Continued)

*Primary Examiner* — Niki H Nguyen

(57) ABSTRACT

The present disclosure relates to a top emitting AMOLED display panel, a manufacturing method thereof, and a display device. The top emitting AMOLED display panel includes a passivation layer and a protective conductive layer. The passivation layer is sandwiched between an interlayer insulating layer and a planarization layer of the top emitting AMOLED display panel; the protective conductive layer covers a metal layer and side walls of openings. The passivation layer covering the metal layer can physically protect and prevent the metal layer from oxidation, and the protective conductive layer coats the metal layer to prevent the metal layer from being etched or oxidized by anode etching solution.

20 Claims, 3 Drawing Sheets

(51) Int. Cl.
  *H10K 50/86* (2023.01)
  *H10K 71/00* (2023.01)
  *H10K 102/00* (2023.01)

(58) Field of Classification Search
  CPC .... H10K 59/122; H10K 59/12; H10K 59/131; H10K 59/1201; H10K 59/123; H10K 59/124; H10K 50/824; H10K 59/1213; H10K 2102/351; H10K 50/818; H10K 59/00; H10K 59/1315; H10K 59/35; H10K 50/81; H10K 59/126; H10K 50/805; H10K 50/82; H10K 50/822; H10K 50/84; H10K 2102/301; H10K 50/00; H10K 50/11; H10K 50/826; H10K 50/841; H10K 59/10; H10K 59/1216; H10K 59/38; H10K 59/40; H10K 71/621; H10K 10/466; H10K 10/472; H10K 10/474; H10K 10/484; H10K 10/84; H10K 10/88; H10K 2101/80; H10K 2102/3035; H10K 50/14; H10K 50/16; H10K 50/854
  See application file for complete search history.

(56) References Cited

FOREIGN PATENT DOCUMENTS

| | | | |
|---|---|---|---|
| CN | 110246866 | | 9/2019 |
| CN | 110890400 | | 3/2020 |
| CN | 111430441 | | 7/2020 |
| CN | 111162090 | | 8/2020 |
| KR | 20080086201 A | * | 9/2008 |
| KR | 20130109393 A | * | 10/2013 |

* cited by examiner

TOP EMITTING AMOLED DISPLAY PANEL, MANUFACTURING METHOD THEREOF, AND DISPLAY DEVICE

RELATED APPLICATIONS

This application is a National Phase of PCT Patent Application No. PCT/CN2020/122680 having International filing date of Oct. 22, 2020, which claims the benefit of priority of Chinese Patent Application No. 202010928470.X filed on Sep. 7, 2020. The contents of the above applications are all incorporated by reference as if fully set forth herein in their entirety.

FIELD AND BACKGROUND OF THE INVENTION

The present disclosure relates to the field of display technologies, and particularly relates to a top emitting active-matrix organic light-emitting diode (AMOLED) display panel, a manufacturing method thereof, and a display device.

AMOLED display technology has been widely used due to its advantages of fast response, self-illumination, excellent display effect, and low power consumption An AMOLED panel generally uses copper or copper alloy with good conductivity for metal wirings. For a bonding pad area, the copper cannot be exposed to a surface as a bonding pad. At present, indium tin oxides (ITO) are used as a bonding pad in a bottom emitting AMOLED panel. However, it is found that as ITO/argentum (Ag)/ITO or indium zinc oxide (IZO)/Ag/IZO are generally used as a top emitting anode in development of top emitting AMOLED panels, in a process of etching the anode, if the bonding pad is the ITO, acid liquor will penetrate into the ITO and etch a metal layer below, which will eventually cause the bonding pad to be abnormal. If the bonding pad is a composite layer with metallic silver, it is prone to encounter silver oxidation in a Reliant Appraise (RA) testing, and in a process of etching a metal layer in a luminescent area, a problem of copper oxidation will also appear.

In a process of implementation, the inventors found that there is at least a following problem in a conventional technology: conventional AMOLED panels have a problem of poor electrical signal transmission.

SUMMARY OF THE INVENTION

Based on this, it is necessary to provide a top emitting AMOLED display panel, a manufacturing method thereof, and a display device for the problem of poor electrical signal transmission in the conventional AMOLED panels.

In order to achieve the above purpose, on one hand, a top emitting AMOLED display panel is provided in an embodiment of the present disclosure. The top emitting AMOLED display panel includes a passivation layer and a protective conductive layer;

the passivation layer is sandwiched between an interlayer insulating layer and a planarization layer of the top emitting AMOLED display panel, openings corresponding to a metal layer are defined in the passivation layer, and the metal layer is a metal layer formed on the interlayer insulating layer; and the protective conductive layer covers the metal layer and side walls of the openings, and a part of the protective conductive layer extends to the passivation layer.

On the other hand, a manufacturing method of a top emitting AMOLED display panel is further provided in the embodiment of the present disclosure. The manufacturing method includes following steps:

providing a glass substrate, wherein a light-shielding layer, a buffer layer, a semiconductor layer, a gate insulating layer, a gate metal layer, an interlayer insulating layer, and a metal layer formed on the interlayer insulating layer are formed on the glass substrate;

forming a passivation layer on the interlayer insulating layer;

defining openings corresponding to the metal layer in the passivation layer; and forming a protective conductive layer on side walls of the openings, the metal layer, and the interlayer insulating layer.

On the other hand, a display device is further provided in the embodiment of the present disclosure. The display device includes a top emitting AMOLED display panel;

the top emitting AMOLED display panel includes a passivation layer and a protective conductive layer;

the passivation layer is sandwiched between an interlayer insulating layer and a planarization layer of the top emitting AMOLED display panel, openings corresponding to a metal layer are defined in the passivation layer, and the metal layer is a metal layer formed on the interlayer insulating layer; and the protective conductive layer covers the metal layer and side walls of the openings, and a part of the protective conductive layer extends to the passivation layer.

The top emitting AMOLED display panel provided by each embodiment of the present disclosure includes a passivation layer and a protective conductive layer. The passivation layer is sandwiched between an interlayer insulating layer and a planarization layer of the top emitting AMOLED display panel; openings corresponding to a metal layer are defined in the passivation layer, the metal layer is a metal layer formed on the interlayer insulating layer. The protective conductive layer covers the metal layer and side walls of the openings, and a part of the protective conductive layer extends to the passivation layer. Wherein, the passivation layer covers the metal layer formed on the interlayer insulating layer, which can physically protect and prevent the metal layer from oxidation, and the protective conductive layer coats the metal layer to prevent the metal layer from being etched or oxidized by anode etching solution in a subsequent process, so as to improve a reliability of electrical signal transmission and improve a performance of the top emitting AMOLED display panel.

DESCRIPTION OF SPECIFIC EMBODIMENTS OF THE INVENTION

In order to facilitate an understanding of the present disclosure, a more comprehensive description of the present disclosure will be given below with reference to relevant accompanying drawings. Preferred embodiments of the present disclosure are shown in the accompanying drawings. However, the present disclosure may be implemented in many different forms and is not limited to embodiments described herein. On the contrary, these embodiments are provided to make the disclosure of the present disclosure more thorough and comprehensive.

It should be noted that when an element is considered to be "connected" to another element, it can be directly connected to and combined with another element, or there may be a centering element at the same time. The terms "dispose", "contact", "sandwich" and similar expressions are used for illustrative purposes only in the present disclosure.

Unless otherwise defined, all technical and scientific terms used herein have same meanings as those commonly understood by those skilled in a technical field of the present disclosure. The terms used in a specification of the present disclosure are only for a purpose of describing specific embodiments, and are not intended to limit the present disclosure. The term "and/or" as used herein includes any and all combinations of one or more related listed items.

Figure 1:
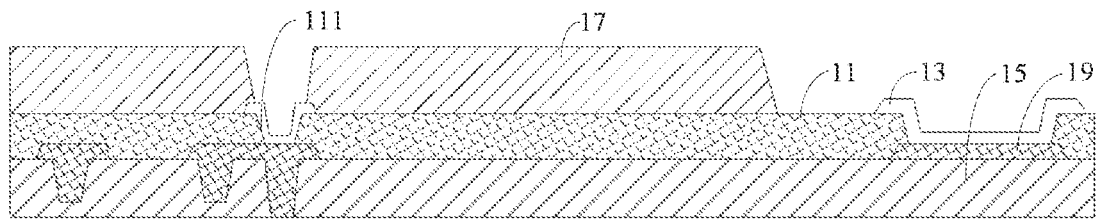
FIG. 1 is a structural schematic view of a top emitting AMOLED display panel provided in an embodiment.

In order to solve the problem of poor electrical signal transmission in conventional AMOLED panels, in an embodiment, as shown in FIG. 1, a top emitting AMOLED display panel is provided. The top emitting AMOLED display panel includes a passivation layer 11 and a protective conductive layer 13.

The passivation layer 11 is sandwiched between an interlayer insulating layer 15 and a planarization layer 17 of the top emitting AMOLED display panel; openings 111 corresponding to a metal layer 19 are defined in the passivation layer 11; and the metal layer 19 is a metal layer formed on the interlayer insulating layer 15.

The protective conductive layer 13 covers the metal layer 19 and side walls of the openings 111, and a part of the protective conductive layer 13 extends to the passivation layer 11.

It should be noted that the passivation layer is a protective layer formed by insulating materials, which is formed on the interlayer insulating layer of the top emitting AMOLED display panel, and covers the metal layer disposed on the interlayer insulating layer to physically protect the metal layer. Wherein, the metal layer includes a source drain electrode metal layer in a display area and a metal layer in a bonding pad area. The passivation layer is patterned, and openings corresponding to the metal layer are defined to expose the metal layer for a subsequent process. In an example, the passivation layer is a thin film with a one-layered structure; in another example, the passivation layer is a thin film with a two-layered structure; in another example, the passivation layer is a thin film with a multi-layered structure. A specific number of layers can be determined according to an actual demand. In order to achieve insulation passivation, in an example, the passivation layer is a silicon oxide ($SiO_x$) material layer; in another example, the passivation layer is a silicon nitride ($SiN_x$) material layer. Furthermore, when the passivation layer is a thin film with two or more layers, $SiO_x$ or $SiN_x$ can be selected at will for different layers.

The protective conductive layer is formed on the metal layer and side walls of the openings, and a part of the protective conductive layer extends to the passivation layer. The protective conductive layer can prevent the metal layer disposed on the interlayer insulating layer from being exposed directly and being corroded or oxidized by etching solution in a subsequent process, for example, in a process of etching a pixel electrode layer, acid solution can be prevented from penetrating into the metal layer disposed on the interlayer insulating layer to corrode it; alternatively, the protective conductive layer can prevent the metal layer disposed on the interlayer insulating layer of the bonding pad area from being directly exposed and being oxidized in a subsequent process (e.g., RA testing). Furthermore, the protective conductive layer also plays a role of electrical signal transmission. The protective conductive layer has a performance of the electrical signal transmission, which can realize the electrical signal transmission between the metal layer and a pixel anode layer. The protective conductive layer can be formed by materials that can conduct electrical signals and resist etching liquid corrosion. In an example, the protective conductive layer is a molybdenum titanium alloy (MoTi) material layer.

The metal layer disposed on the interlayer insulating layer includes the source drain electrode metal layer of the display area and the metal layer of the bonding pad area. In an example, materials of the metal layer are as follows but not limited to: molybdenum (Mo), titanium (Ti), copper (Cu), or other alloys. In an example, the interlayer insulating layer is a thin film with a one-layered structure; in another example, the interlayer insulating layer is a thin film with a two-layered structure; in another example, the interlayer insulating layer is a thin film with a multi-layered structure. A specific number of layers can be determined according to an actual demand. In order to achieve insulation passivation, in an example, the interlayer insulating layer is a $SiO_x$ material layer; in another example, the interlayer insulating layer is a $SiN_x$ material layer. Furthermore, when the interlayer insulating layer is a thin film with two or more layers, $SiO_x$ or $SiN_x$ can be selected at will for different layers.

The planarization layer is configured to provide a flat bearing surface for a subsequent process. In an example, the planarization layer is a thin film with a one-layered structure; in another example, the planarization layer is a thin film with a two-layered structure. A material of the planarization layer is as follows but not limited to silicon oxide.

Figure 2:
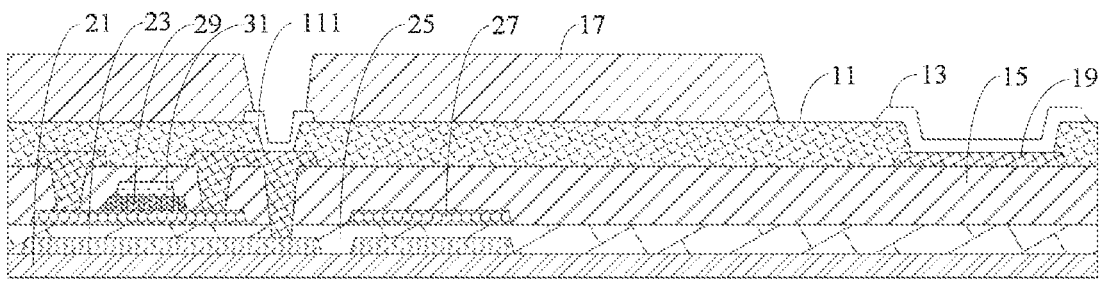
FIG. 2 is a structural schematic view of a top emitting AMOLED display panel in another embodiment.

Furthermore, as shown in FIG. 2, the top emitting AMOLED display panel further includes a glass substrate 21, a light-shielding layer 23, a buffer layer 25, a semiconductor layer 27, a gate insulating layer 29, and a gate metal layer 31.

The light-shielding layer 23 is sandwiched between the glass substrate 21 and the buffer layer 25.

The semiconductor layer 27 is disposed on the buffer layer 25.

The gate insulating layer 29 is sandwiched between the semiconductor layer 27 and the gate metal layer 31.

The interlayer insulating layer 15 is disposed on the buffer layer 25 and coats the semiconductor layer 27, the gate insulating layer 29, and the gate metal layer 31.

It should be noted that the glass substrate is a supporting structure of the top emitting AMOLED display panel. The light-shielding layer is disposed on the glass substrate. Materials of the light-shielding layer are as follows but not limited to following materials: Mo, Ti, Cu, or other alloys.

The buffer layer is disposed on the glass substrate and coats the light-shielding layer. In an example, the buffer layer is a thin film with a one-layered structure; in another example, the buffer layer is a thin film with a two-layered structure; in another example, the buffer layer is a thin film with a multi-layered structure. A specific number of layers can be determined according to an actual demand. In order to achieve insulation passivation, in an example, the buffer layer is a $SiO_x$ material layer; in another example, the buffer layer is a $SiN_x$ material layer. Furthermore, when the buffer layer is a thin film with two or more layers, $SiO_x$ or $SiN_x$ can be selected at will for different layers.

The semiconductor layer is disposed on the buffer layer. Materials of the semiconductor layer are as follows but not limited to following materials: indium gallium zinc oxide (IGZO), indium zinc tin oxide (IZTO), or indium gallium zinc tin oxide (IGZTO).

The gate insulating layer is disposed on the semiconductor layer. In an example, the gate insulating layer is a thin film with a one-layered structure; in another example, the gate insulating layer is a thin film with a two-layered structure; in another example, the gate insulating layer is a thin film with a multi-layered structure. A specific number of layers can be determined according to an actual demand. In order to achieve insulation passivation, in an example, the gate insulating layer is a $SiO_x$ material layer; in another example, the gate insulating layer is a $SiN_x$ material layer. Furthermore, when the gate insulating layer is a thin film with two or more layers, $SiO_x$ or $SiN_x$ can be selected at will for different layers.

The gate metal layer is disposed on the gate insulating layer. Materials of the gate metal layer are as follows but not limited to following materials: Mo, Ti, Cu, or other alloys.

Figure 3:
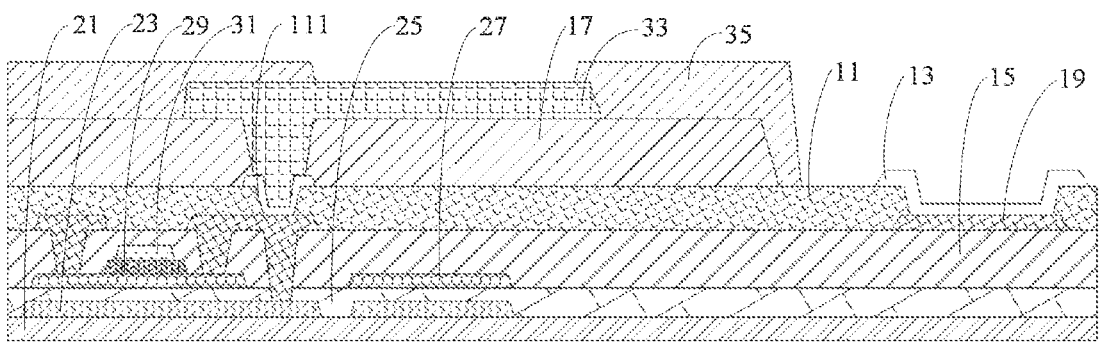
FIG. 3 is a structural schematic view of a top emitting AMOLED display panel in yet another embodiment.

Furthermore, as shown in FIG. 3, the top emitting AMOLED display panel further includes a pixel electrode layer 33 and a pixel definition layer 35.

The pixel electrode layer 33 is disposed on the planarization layer 17, and the pixel electrode layer 33 penetrates the planarization layer 17 to correspondingly contact the protective conductive layer 13.

The pixel definition layer 35 is disposed on the planarization layer 17.

The pixel electrode layer is disposed on the planarization layer. Materials of the pixel electrode layer are as follows but not limited to following materials: ITO/Ag/ITO, IZO/Ag/IZO, etc.

The top emitting AMOLED display panel provided by each embodiment of the present disclosure includes the passivation layer and the protective conductive layer. The passivation layer is sandwiched between the interlayer insulating layer and the planarization layer of the top emitting AMOLED display panel, the openings corresponding to the metal layer are defined in the passivation layer, and the metal layer is a metal layer formed on the interlayer insulating layer. The protective conductive layer covers the metal layer and side walls of the openings, and a part of the protective conductive layer extends to the passivation layer. Wherein, the passivation layer covers the metal layer formed on the interlayer insulating layer, which can physically protect and prevent the metal layer from oxidation, and the protective conductive layer coats the metal layer to prevent the metal layer from being etched or oxidized by anode etching solution in the subsequent process, so as to improve a reliability of electrical signal transmission and improve a performance of the top emitting AMOLED display panel.

Figure 4:
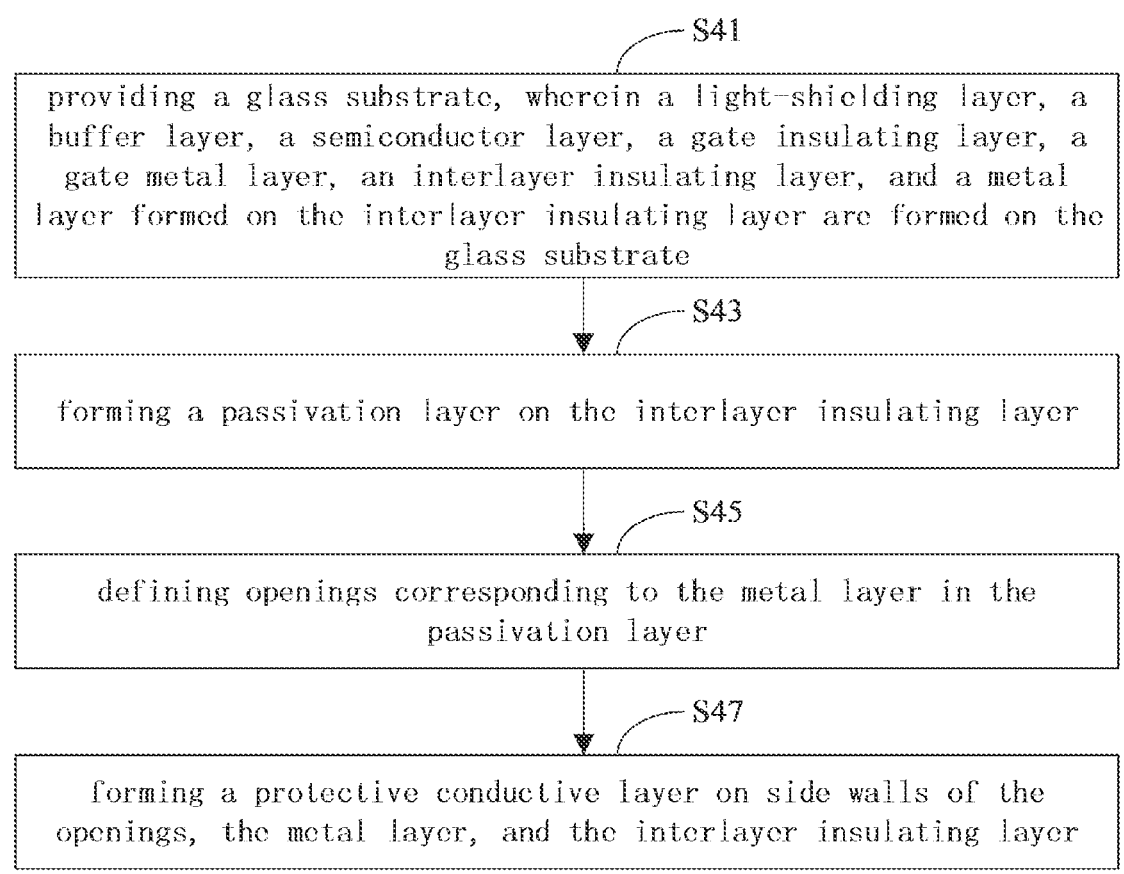
FIG. 4 is a flow diagram of a manufacturing method of a top emitting AMOLED display panel in an embodiment.

In an embodiment, as shown in FIG. 4, a manufacturing method of a top emitting AMOLED display panel is further provided. The manufacturing method of the top emitting AMOLED display panel includes following steps:

step 41, providing a glass substrate, wherein a light-shielding layer, a buffer layer, a semiconductor layer, a gate insulating layer, a gate metal layer, an interlayer insulating layer, and a metal layer formed on the interlayer insulating layer are formed on the glass substrate.

It should be noted that the light-shielding layer, the buffer layer, the semiconductor layer, the gate insulating layer, the gate metal layer, the interlayer insulating layer, and the metal layer formed on the interlayer insulating layer are sequentially formed on the glass substrate by using a deposition process, an etching process, etc. Wherein, the deposition process can be any one of following processes: chemical vapor deposition (CVD), physical vapor deposition (PVD), atomic layer deposition (ALD), low pressure chemical vapor deposition (LPCVD), laser ablation deposition (LAD), and selective epitaxial growth (SEG). The etching process is dry etching or wet etching.

The glass substrate is a supporting structure of the top emitting AMOLED display panel. The light-shielding layer is disposed on the glass substrate. Materials of the light-shielding layer are as follows but not limited to following materials: Mo, Ti, Cu, or other alloys.

The buffer layer is disposed on the glass substrate and coats the light-shielding layer. In an example, the buffer layer is a thin film with a one-layered structure; in another example, the buffer layer is a thin film with a two-layered structure; in another example, the buffer layer is a thin film with a multi-layered structure. A specific number of layers can be determined according to an actual demand. In order to achieve insulation passivation, in an example, the buffer layer is a $SiO_x$ material layer; in another example, the buffer layer is a $SiN_x$ material layer. Furthermore, when the buffer layer is a thin film with two or more layers, $SiO_x$ or $SiN_x$ can be selected at will for different layers.

The semiconductor layer is disposed on the buffer layer. Materials of the semiconductor layer are as follows but not limited to following materials: IGZO, IZTO, or IGZTO.

The gate insulating layer is disposed on the semiconductor layer. In an example, the gate insulating layer is a thin film with a one-layered structure; in another example, the gate insulating layer is a thin film with a two-layered structure; in another example, the gate insulating layer is a thin film with a multi-layered structure. A specific number of layers can be determined according to an actual demand. In order to achieve insulation passivation, in an example, the gate insulating layer is a $SiO_x$ material layer; in another example, the gate insulating layer is a $SiN_x$ material layer. Furthermore, when the gate insulating layer is a thin film with two or more layers, $SiO_x$ or $SiN_x$ can be selected at will for different layers.

The gate metal layer is disposed on the gate insulating layer. Materials of the gate metal layer are as follows but not limited to following materials: Mo, Ti, Cu, or other alloys.

In an example, the interlayer insulating layer is a thin film with a one-layered structure; in another example, the interlayer insulating layer is a thin film with a two-layered structure; in another example, the interlayer insulating layer is a thin film with a multi-layered structure. A specific number of layers can be determined according to an actual demand. In order to achieve insulation passivation, in an example, the interlayer insulating layer is a $SiO_x$ material layer; in another example, the interlayer insulating layer is a $SiN_x$ material layer. Furthermore, when the interlayer insulating layer is a thin film with two or more layers, $SiO_x$ or $SiN_x$ can be selected at will for different layers. The metal layer disposed on the interlayer insulating layer includes the source drain electrode metal layer of the display area and the metal layer of the bonding pad area. In an example, materials of the metal layer are as follows but not limited to: Mo, Ti, Cu, or other alloys.

The planarization layer is configured to provide a flat bearing surface for a subsequent process. In an example, the planarization layer is a thin film with a one-layered structure; in another example, the planarization layer is a thin film with a two-layered structure. A material of the planarization layer is as follows but not limited to silicon oxide.

Step 43, forming a passivation layer on the interlayer insulating layer.

The passivation layer is a protective layer formed by insulating materials, which is formed on the interlayer insulating layer of the top emitting AMOLED display panel, and covers the metal layer disposed on the interlayer insulating layer to physically protect the metal layer. Wherein, the metal layer includes a source drain electrode metal layer in a display area and a metal layer in a bonding pad area. The passivation layer is patterned and openings corresponding to the metal layer are defined to expose the metal layer for a subsequent process. In an example, the passivation layer is a thin film with a one-layered structure; in another example, the passivation layer is a thin film with a two-layered structure; in another example, the passivation layer is a thin film with a multi-layered structure. A specific number of layers can be determined according to an actual demand. In order to achieve insulation passivation, in an example, in the step of forming the passivation layer on the interlayer insulating layer: depositing $SiO_x$ material on the interlayer insulating layer to form the passivation layer; in another example, in the step of forming the passivation layer on the interlayer insulating layer: depositing $SiN_x$ material on the interlayer insulating layer to form the passivation layer. Furthermore, when the passivation layer is a thin film with two or more layers, $SiO_x$ or $SiN_x$ can be selected at will for different layers.

Step 45, defining openings corresponding to the metal layer in the passivation layer.

Step 47, forming a protective conductive layer on side walls of the openings, the metal layer, and the interlayer insulating layer.

The protective conductive layer is formed on the metal layer and side walls of the openings, and a part of the protective conductive layer extends to the passivation layer. The protective conductive layer can prevent the metal layer disposed on the interlayer insulating layer from being exposed directly and being corroded or oxidized by etching solution in a subsequent process, for example, in a process of etching a pixel electrode layer, acid solution can be prevented from penetrating into the metal layer disposed on the interlayer insulating layer to corrode it; alternatively, the protective conductive layer can prevent the metal layer on the insulating layer of the bonding pad area from being directly exposed and being oxidized in a subsequent process (e.g., RA testing). Furthermore, the protective conductive layer also plays a role of electrical signal transmission. The protective conductive layer has the performance of the electrical signal transmission, which can realize the electrical signal transmission between the metal layer and a pixel anode layer. The protective conductive layer can be formed by materials that can conduct electrical signals and resist etching liquid corrosion. In an example, in the step of forming the protective conductive layer on the side walls of the openings, the metal layer, and the interlayer insulating layer: depositing MoTi material on the side walls of the openings, the metal layer, and the interlayer insulating layer to form the protective conductive layer.

Figure 5:
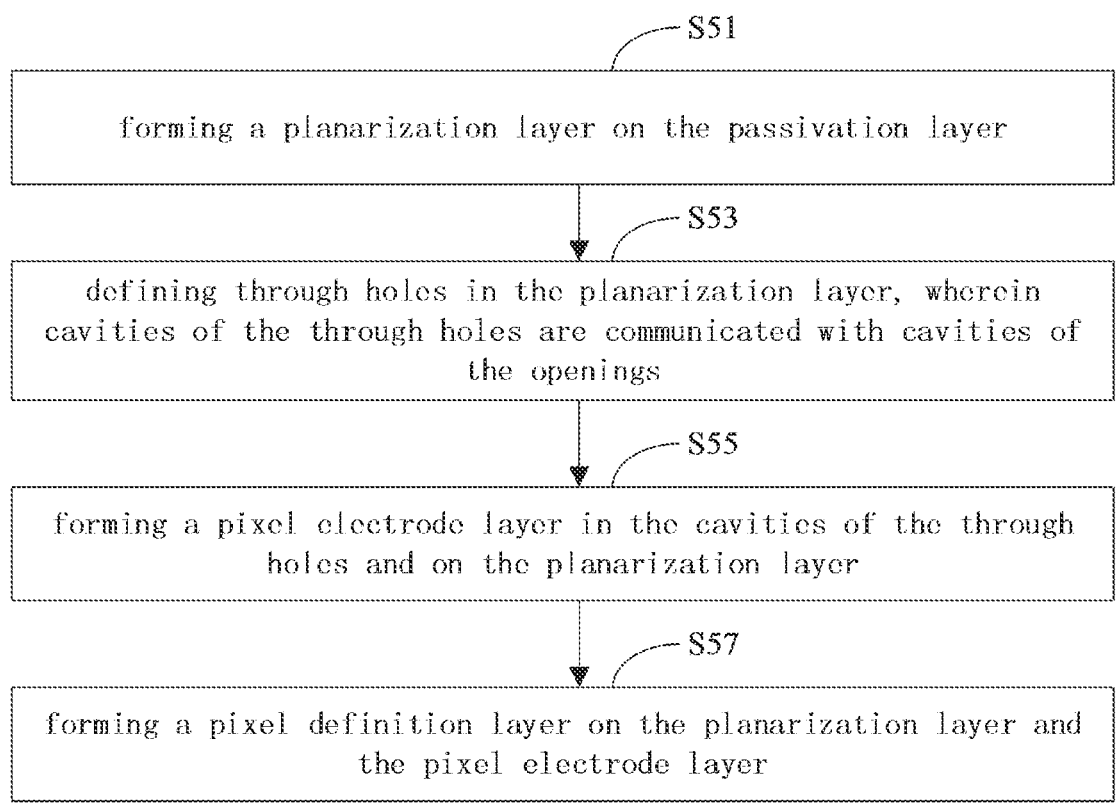
FIG. 5 is a flow diagram of a manufacturing method of a top emitting AMOLED display panel in another embodiment.

Furthermore, as shown in FIG. 5, the manufacturing method of the top emitting AMOLED display panel further includes steps:

step 51, forming a planarization layer on the passivation layer;

step 53, defining through holes in the planarization layer, wherein cavities of the through holes are communicated with cavities of the openings;

step 55, forming a pixel electrode layer in the cavities of the through holes and on the planarization layer; and step 57, forming a pixel definition layer on the planarization layer and the pixel electrode layer.

It should be noted that the planarization layer is configured to provide a flat bearing surface for a subsequent process. In an example, the planarization layer is a thin film with a one-layered structure; in another example, the planarization layer is a thin film with a two-layered structure. A material of the planarization layer is as follows but not limited to silicon oxide.

The pixel electrode layer is disposed on the planarization layer. Materials of the pixel electrode layer are as follows but not limited to following materials: ITO/Ag/ITO, IZO/Ag/IZO, etc.

In each embodiment of the manufacturing method of the top emitting AMOLED display panel of the present disclosure, through covering the passivation layer on the metal layer formed on the interlayer insulating layer to physically protect and prevent the metal layer from oxidation, the protective conductive layer coats the metal layer to prevent the metal layer from being etched or oxidized by anode etching solution in the subsequent process, so as to improve a reliability of the electrical signal transmission, and the protective conductive layer has performance of the electrical signal transmission, which can realize the electrical signal transmission between the metal layer disposed on the interlayer insulating layer and other metal layers in the top emitting AMOLED display panel.

In an embodiment, a display device is provided. The display device includes the top emitting AMOLED display panel described in each embodiment of the top emitting AMOLED display panel of the present disclosure.

Technical features of above described embodiments can be arbitrarily combined. In order to simplify the description, all possible combinations of the technical features in the above described embodiments are not described. However, as long as there is no contradiction in combination of these technical features, they shall be considered as a scope of the specification.

The above described embodiments only express several embodiments of the present disclosure, and descriptions are more specific and detailed, but it cannot be understood as a restriction on a scope of the present disclosure. It should be pointed out that, for ordinary technical personnel in the art, certain modifications and improvements can be made without departing from a concept of the present disclosure, which fall within a protection scope of the present disclosure. Therefore, the protection scope of the present disclosure shall be subject to attached claims.

What is claimed is:

1. A top emitting active-matrix organic light-emitting diode (AMOLED) display panel, comprising a passivation layer and a protective conductive layer;

wherein the passivation layer is sandwiched between an interlayer insulating layer and a planarization layer of the top emitting AMOLED display panel, openings corresponding to a metal layer are defined in the passivation layer, and the metal layer is a metal layer formed on the interlayer insulating layer; and wherein the protective conductive layer covers the metal layer and side walls of the openings, and a part of the protective conductive layer extends to the passivation layer.

2. The top emitting AMOLED display panel as claimed in claim 1, wherein the top emitting AMOLED display panel further comprises a glass substrate, a light-shielding layer, a buffer layer, a semiconductor layer, a gate insulating layer, and a gate metal layer;
the light-shielding layer is sandwiched between the glass substrate and the buffer layer;
the semiconductor layer is disposed on the buffer layer;
the gate insulating layer is sandwiched between the semiconductor layer and the gate metal layer; and
the interlayer insulating layer is disposed on the buffer layer and coats the semiconductor layer, the gate insulating layer, and the gate metal layer.

3. The top emitting AMOLED display panel as claimed in claim 2, wherein the top emitting AMOLED display panel further comprises a pixel electrode layer and a pixel definition layer;
the pixel electrode layer is disposed on the planarization layer, and the pixel electrode layer penetrates the planarization layer to correspondingly contact the protective conductive layer; and
the pixel definition layer is disposed on the planarization layer.

4. The top emitting AMOLED display panel as claimed in claim 1, wherein the protective conductive layer is a molybdenum titanium alloy (MoTi) material layer.

5. The top emitting AMOLED display panel as claimed in claim 2, wherein the protective conductive layer is a MoTi material layer.

6. The top emitting AMOLED display panel as claimed in claim 3, wherein the protective conductive layer is a MoTi material layer.

7. The top emitting AMOLED display panel as claimed in claim 1, wherein the passivation layer is a thin film with a one-layered structure, a two-layered structure, or a multi-layered structure.

8. The top emitting AMOLED display panel as claimed in claim 2, wherein the passivation layer is a thin film with a one-layered structure, a two-layered structure, or a multi-layered structure.

9. The top emitting AMOLED display panel as claimed in claim 3, wherein the passivation layer is a thin film with a one-layered structure, a two-layered structure, or a multi-layered structure.

10. The top emitting AMOLED display panel as claimed in claim 7, wherein the passivation layer is a silicon oxide ($SiO_x$) material layer or a silicon nitride ($SiN_x$) material layer.

11. A manufacturing method of a top emitting AMOLED display panel, comprising following steps:
providing a glass substrate, wherein a light-shielding layer, a buffer layer, a semiconductor layer, a gate insulating layer, a gate metal layer, an interlayer insulating layer, and a metal layer formed on the interlayer insulating layer are formed on the glass substrate;
forming a passivation layer on the interlayer insulating layer;
defining openings corresponding to the metal layer in the passivation layer; and
forming a protective conductive layer on side walls of the openings, the metal layer, and the interlayer insulating layer.

12. The manufacturing method of the top emitting AMOLED display panel as claimed in claim 11, wherein the manufacturing method further comprises steps of:
forming a planarization layer on the passivation layer;
defining through holes in the planarization layer, wherein cavities of the through holes are communicated with cavities of the openings;
forming a pixel electrode layer in the cavities of the through holes and on the planarization layer; and
forming a pixel definition layer on the planarization layer and the pixel electrode layer.

13. The manufacturing method of the top emitting AMOLED display panel as claimed in claim 11, wherein in the step of forming the protective conductive layer on the side walls of the openings, the metal layer, and the interlayer insulating layer:
depositing MoTi material on the side walls of the openings, the metal layer, and the interlayer insulating layer to form the protective conductive layer.

14. The manufacturing method of the top emitting AMOLED display panel as claimed in claim 12, wherein in the step of forming the protective conductive layer on the side walls of the openings, the metal layer, and the interlayer insulating layer:
depositing MoTi material on the side walls of the openings, the metal layer, and the interlayer insulating layer to form the protective conductive layer.

15. The manufacturing method of the top emitting AMOLED display panel as claimed in claim 11, wherein the passivation layer is a thin film with a one-layered structure, a two-layered structure, or a multi-layered structure.

16. The manufacturing method of the top emitting AMOLED display panel as claimed in claim 15, wherein in the step of forming the passivation layer on the interlayer insulating layer:
depositing $SiO_x$ material on the interlayer insulating layer to form the passivation layer; or
depositing $SiN_x$ material on the interlayer insulating layer to form the passivation layer.

17. A display device, comprising a top emitting AMOLED display panel;
wherein the top emitting AMOLED display panel comprises a passivation layer and a protective conductive layer;
wherein the passivation layer is sandwiched between an interlayer insulating layer and a planarization layer of the top emitting AMOLED display panel, openings corresponding to a metal layer are defined in the passivation layer, and the metal layer is a metal layer formed on the interlayer insulating layer; and
wherein the protective conductive layer covers the metal layer and side walls of the openings, and a part of the protective conductive layer extends to the passivation layer.

18. The display device as claimed in claim 17, wherein the display device further comprises a glass substrate, a light-shielding layer, a buffer layer, a semiconductor layer, a gate insulating layer, and a gate metal layer;
the light-shielding layer is sandwiched between the glass substrate and the buffer layer;
the semiconductor layer is disposed on the buffer layer;
the gate insulating layer is sandwiched between the semiconductor layer and the gate metal layer; and
the interlayer insulating layer is disposed on the buffer layer and coats the semiconductor layer, the gate insulating layer, and the gate metal layer.

19. The display device as claimed in claim 18, wherein the display device further comprises a pixel electrode layer and a pixel definition layer;
the pixel electrode layer is disposed on the planarization layer, and the pixel electrode layer penetrates the planarization layer to correspondingly contact the protective conductive layer; and the pixel definition layer is disposed on the planarization layer.

20. The display device as claimed in claim 17, wherein the protective conductive layer is a MoTi material layer.

* * * * *